United States Patent [19]
Mitani et al.

[11] Patent Number: 5,478,408
[45] Date of Patent: Dec. 26, 1995

[54] SOI SUBSTRATE AND MANUFACTURING METHOD THEREFOR

[75] Inventors: Kiyoshi Mitani; Masatake Katayama, both of Gunma; Kazushi Nakazawa, Nagano, all of Japan

[73] Assignee: Shin-Etsu Handotai Co., Ltd., Tokyo, Japan

[21] Appl. No.: 408,798

[22] Filed: Mar. 23, 1995

[30] Foreign Application Priority Data

Mar. 25, 1994 [JP] Japan .................................. 6-079602

[51] Int. Cl.$^6$ ................................................ H01L 21/265
[52] U.S. Cl. ............................ 448/33.3; 437/62; 437/974; 148/DIG. 12
[58] Field of Search .............................. 437/62, 63, 974; 148/DIG. 12, 33.3

[56] References Cited

U.S. PATENT DOCUMENTS

| | | | |
|---|---|---|---|
| 4,983,251 | 1/1991 | Haisma et al. | 148/DIG. 12 |
| 5,362,667 | 11/1994 | Linn et al. | 148/DIG. 12 |
| 5,366,923 | 11/1994 | Beyer et al. | 437/62 |
| 5,366,924 | 11/1994 | Easter et al. | 148/DIG. 12 |

Primary Examiner—Tom Thomas
Assistant Examiner—Trung Dang
Attorney, Agent, or Firm—Lowe, Price, LeBlanc & Becker

[57] ABSTRACT

There is provided an SOI (Silicon On Insulator) substrate having a thick SOI layer, where crystallographic defects mainly consisting of OSFs (Oxidation Induced Stacking Fault) are practically prevented from occurrence in the SOI layer, according to the present invention.

The manufacturing method for the SOI substrate according to the present invention comprises the following steps of: the silicon oxide film being formed by thermal oxidation on the surface of a first silicon wafer having a concentration of interstitial oxygen under 16 ppma (per JEIDA Standard); the first silicon wafer being superimposed on a second silicon wafer, which is a support for supporting the first silicon wafer, with the silicon oxide film sandwiched therebetween; then the superimposed wafers being heat-treated so as to obtain a bonded wafer; and further the bulk of the first silicon wafer of the bonded wafer being reduced by grinding and then polishing so as to obtain the SOI substrate with the SOI layer of more than 5 μm in thickness, which is a single crystal layer, formed on the second silicon wafer.

4 Claims, 3 Drawing Sheets

1

SOI SUBSTRATE AND MANUFACTURING METHOD THEREFOR

BACKGROUND OF THE INVENTION

1. Field of the Invention

The present invention relates to a manufacturing method for the SOI (an abridgement of Silicon On Insulator) substrate which is so formed that silicon wafers are bonded face to face with an insulating film therebetween, and more particularly to the manufacturing method for the SOI substrate wherein the quality of the single crystal layer thereof in which semiconductor devises are fabricated is crystallographically improved.

2. Description of the Prior Art

At the very beginning stage of development of integrated circuitry was a desire of obtaining silicon single crystal grown on an insulator substrate (hereinafter this will be referred to as SOI structure). It was the reason therefor that SOI structure has a plenty of advantages such as making miniaturization or effective isolation of elements possible, easier achievement of high reliability in the semiconductor devise performance through increase in dielectric strength, insensitiveness to soft errors and minimization of a latch-up phenomenon and realization of high frequency operation through lower parasitic interconnect capacitance.

These features of SOI structure are now increasingly more highly thought of in the current integrated circuitry technology in pursuit of further miniaturization and ever-increased packing densities, while recently the so-called power integrated circuit, which incorporates a high voltage devise(s) as part in the same silicon chip, becomes more and more popular in such electronics fields as constant-voltage power circuits for electronic automatic exchange, discharge-type printer or plasma display or automobile electronics and along this trend a new SOI structure has become required that a thicker silicon single crystal layer of, for example 5 μm~50 μm thick is formed on the insulator substrate.

For isolation in power integrated circuits the pn junction does not work properly in regard to peak inverse voltage and in addition Joule heating, increase in the leakage current due to the heating and other unstable phenomena are not avoided without the use of $SiO_2$ isolation.

Conventionally there was known a method to realize SOI structure that silicon single crystal is directly grown by the vapor growth technique on a single crystal insulator substrate, for example a sapphire substrate, by which the silicon single crystal with crystallographically good quality is not obtained. The method, therefore, can not be said to have succeeded in the sense of practicality. There is also known another technology attracting public attention that oxygen ions are implanted into the surface region of a single crystal wafer and thus a buried oxide layer is formed in bulk across the full wafer (This technology is called SIMOX or Separation by Implanted Oxygen). This technology has problems that the quality of the buried oxide layer and the crystallographic quality of the surface region is not satisfactory and the surface region is poor in dielectric strength due to the poor crystallographic quality, which means there will be still a long way to put it to practical use.

In addition to the manufacturing technologies of the above-mentioned SOI structure, there is still another method that attract keener public attention as being put faster to practical use which includes the method according to the present invention in the technological category, where silicon wafers are directly bonded each other with an $SiO_2$ film sandwiched therebetween. In the men, hod, SOI substrate has as a constituent a single crystal with a good quality from the Czochralski method to fabricate semiconductor devises therein and the sandwiched $SiO_2$ film is formed by thermal oxidation, which dielectric strength is generally admitted to be good enough for practical use.

With respect to the SOI substrate made by a conventional technique, the, present inventors have found a problem left unsolved that a plenty of microdefects or mainly oxidation induced stacking faults (herein after referred to as OSF), which originate from deposition of interstitial oxygen atoms, are generated in the bulk of single crystal silicon used for fabricating semiconductor devises (hereinafter SOI layer), when the SOI layer is thick, for example 20 μm to 30 μm or more in thickness, though there is no such problem as mentioned above for the SOI layer having a thickness under about 2 μm. Consequently, it was naturally expected that a big technical problem would arise in the application of SOI structure with a thick SOI layer to the above-mentioned power integrated circuit, since miniaturized elements in an integrated circuit might adversely be affected in performance by power devises incorporated in the same chip.

SUMMARY OF THE INVENTION

The present invention was made in view of the problems of the prior art technology above-mentioned and has an object to provide a manufacturing method for SOI substrates having a thick SOI layer, where the SOI substrates are so produced that occurrence of OSF in the SOI layer is prevented as a main effect and thereby to provide a good or defect-free layer, which is the so-called denuded zone (hereafter referred to as DZ), suitable for fabricating semiconductor devises therein.

The SOI substrate claimed in claim 1 has a structure that it comprises a first silicon wafer, being a single crystal layer, which is processed to an SOI layer for semiconductor devises fabricated therein and a second silicon wafer which is a support for supporting the first wafer, and the both wafers are bonded each other face to face with an silicon oxide film sandwiched therebetween. The substrate is characterized in that the first silicon wafer has a concentration under 16 ppma of interstitial oxygen (per JEIDA Standard) and the thickness of the SOI layer is more than 5 μm and the whole bulk is a DZ layer.

The manufacturing method for an SOI substrate claimed in claim 2, wherein two silicon wafers are bonded each other face to face with a silicon oxide film sandwiched therebetween, is characterized: in that an silicon oxide film is formed by thermal oxidation on the surface of the first silicon wafer having a concentration of interstitial oxygen under 16 ppma (per JEIDA Standard); that the first silicon wafer is superimposed on the second silicon wafer, being a support for supporting the first silicon wafer, with the silicon oxide film sandwiched therebetween and then the superimposed wafers are heat-treated so as to obtain a bonded wafer; and that the bulk of the first silicon wafer of the bonded wafer is thinned by grinding and then polishing so as to obtain the SOI substrate having the SOI layer of more than 5 μm in thickness, which is a single crystal layer, formed on the second silicon wafer.

The manufacturing method for the SOI substrate claimed in claim 3 is characterized in that the silicon oxide film is formed by thermal oxidation at a temperature between 1000° C. to 1300° C. and the thickness of the silicon oxide film is so regulated as to be in a range of 0.1 μm to 5 μm.

The manufacturing method for the SOI substrate claimed in claim 4 is characterized in that the heat-treatment for obtaining the bonded wafer is carried out at a temperature selected in a range of 1000° C. to 1200° C. for at least 30 min; and that the thickness of the DZ layer in the SOI layer, which is a single crystal silicon layer, obtained from the first silicon wafer is at least more than 5 µm.

Now, experiments and the findings or discoveries achieved in the course thereof, which were the; starting points leading to the present invention, will be described below before the description of the examples embodying the manufacturing method for the SOI substrate according to the present invention.

The experiments were carried out in the following manner:

Silicon wafers with a polished surface on a side each were prepared for the experiments, which were obtained from the silicon single crystal grown by the Czochrakski method and had a diameter of 125 mm, a conductivity of n type, a concentration of interstitial oxygen of about 18.5 ppma and a thickness of about 500 µm.

The silicon wafers were rinsed to remove adhesives used for holding fast the wafers on holding plates and half dried residue from polishing slurry after being finished with polishing. The wafers were further cleaned as final finish in an aqueous solution containing ammonia and hydrofluoric acid. The above-mentioned polished surfaces were used as bonding surfaces and the surface roughness was 0.4 nm in Ra (Roughness Average).

Next, the above-mentioned silicon wafers were treated as though the wafers were a single crystal silicon layer in the process for fabrication of semiconductor devises. Samples were prepared in the following four ways to be evaluated as illustrated in FIG. 1(a) in the experiments.

A. one of the wafers was measured of OSF densities after the heat treatment for OSF inspection (, which is a common OSF measurement method).

B. one of the wafers was measured of OSF densities without the heat treatment for OSF inspection directly after the heat treatment for bonding in addition to the heat treatment of thermal oxidation. Hereinafter the OSF measurement without the heat treatment for OSF inspection will be called as the OSF counting.

C. one of the wafers was measured of OSF densissies after the heat treatment for OSF inspection following the two heat treatments of both thermal oxidation and bonding.

D. The other two of the silicon wafers were processed to manufacture an SOI substrate according to the present invention with the only exception of a thickness of 1.5 µm of the SOI layer. A first silicon wafer was treated in the thermal oxidation treatment prior to processing it into the SOI layer. The first silicon wafer was superimposed on the other second wafer to later work as a support for supporting the first silicon wafer and the wafers as superimposed were heat treated to obtain a bonded wafer. The bulks of the first wafer was thinned to a thickness of 1.5 µm and further heat-treated to inspect OSF densities in or on the SOI layer side.

The whole steps or conditions of the above-mentioned treatments are illustrated in FIG. 1(a).

The common measurement method of OSF densities will be described in some depth below: The silicon wafer samples of A and C or the SOI substrate sample of D are treated firstly in a moisturized oxygen atmosphere at a temperature of 1100° C. for 1 hour, then immersed into a hydrofluoric acid aqueous solution of 25% in concentration to remove the oxide film formed on the surface, following the immersion again immersed into a secco-etching solution for selective etching to develop OSFs and after all the foregoing steps the OSF densities on the polished surface of a silicon wafer or the SOI layer are counted with the help of a differential interference microscope or the like.

The measurements shown in FIG. 1(b) of OSF densities were conducted with a differential interference microscope under a magnification of 50 to 200. A sample stage of the microscope was moved so that the observation was performed from one side of the sample edge to the other side in a row (We call this method as cross-scanning method.).

The spatial changes of OSF densities in the direction of thickness in the bulks of the silicon wafers or the SOI layers were measured on sloped polished surfaces created by angle polishing at particular inspection areas, where the inspection surface is inclined downward from the original surface by $\theta$ under a condition of tan $\theta=0.1$, which means $\theta=5° 44'$.

Here, the results of the above experiments will be considered. Even one of the wafers (in the case of the sample A) that was heat treated only for OSF inspection which show low OSF densities increased in the OSF densities after two or three similar heat treatments in a moisturized oxygen atmosphere(as in the cases of the samples B and C). The thin SOI layer of the SOI substrate (in the case of the sample D) that was manufactured from the wafers having the same characteristics which were treated in the same three heat treatments did not increase in the OSF densities. The level of the OSF densities of the sample D is so low as is observed as for the wafers which were not treated by any of the thermal oxidation and the heat treatment for bonding (in the case of the sample A). FIG. 2 is a microphotograph, which shows spatial changes of OSF densities in the direction of thickness, taken on an inspection surface where OSFs were developed by chemical treatment before both reducing the bulk of the first wafer of the bonded wafer of the sample D, while in this particular case the heat treatment thereof for OSF inspection was omitted. The thickness of the SOI layer of the bonded wafer above-mentioned is 1.5 µm at its final stage of the bulk thinning process and with this thickness few OSFs are observed on the exposed surface of the SOI layer. This observation coincides with the showing of the microphotographs of FIG. 2, which were taken for observation of spatial changes of OSF densities in the direction of thickness of the SOI layer. It is also most strikingly observed from the photographs that a vast DZ, which is a defect-free zone, is extended toward the surface of the first silicon wafer and a distance of 20 µm to 30 µm from the bonding boundary is practically free of defects, but beyond the distance OSF densities are very high.

In case that crystal defects occur under the surface of a silicon wafer, the defects work as nuclei of OSFs and thus the surface region becomes a DZ layer. The result of measurement of OSF densities on the sample A shown in FIG. 1(b) is, consequently, compatible with the dependency of OSF densities on the distance from the bonding boundary in the bulk of the SOI layer after the bonding heat treatment, as observed from the photographs above-mentioned.

Conventional SOI substrates have had no problem originating from OSFs or the crystal defects above-mentioned in the devise fabrication. It is the reason for the situation that the maximal thickness of the SIO layer required for the SIO substrate was relatively thin and did not surpass even 10 µm at most in thickness in the past. However, the SOI substrate as thick as 30 µm to 50 µm, which are the thicknesses in the scope of the claims of the present invention shows abnormally high OSF densities in the surface layer remote from the bonding boundary and therefore a means for reducing densities of the crystal defects is demandingly sought in order to put such thick SOI layers to practical use. After the above mentioned findings have been obtained, the inventors have conducted the experiments with a variety of concentrations of interstitial oxygen in silicon wafers as shown in the examples of the present invention being later detailed.

The inventors imagine that the reason why the crystallographic defects are prevented in the bulk of a thick SOI layer is the combination of the following conditions or effects that the concentration of interstitial oxygen of an SOI layer or a first silicon wafer is regulated under 16 ppma; the SIO layer is located adjacent to the boundary of Si and $SiO_2$ (SOI structure which has a buried oxide film seems to increase sites for interstitial silicon atoms to congregate); and the concentration of interstitial oxygen in the surface of an SOI layer is reduced in a heat-treatment before bonding, while the bonding surface of the first silicon wafer becomes later the interior of the SOI substrate after the bonding heat-treatment and thus oxygen atoms become harder to deposit in the bulk of the vicinity of the bonding boundary probably due to a new situation of stress therein different from that in the surface of the first silicon wafer.

BRIEF DESCRIPTION OF THE DRAWINGS

The novel features which are considered characteristic of the present invention are set forth with particularity in the appended claims. The present invention itself, however, and additional objects and advantages thereof will best be understood from the following description of embodiments thereof when read in connection with the accompanying drawings, in which:

in A. the common OSF measurement was conducted on a silicon wafer;

in B. the OSF counting was conducted directly on a silicon wafer after the two steps of heat-treatments required to manufacture an SOI substrate;

in C. the common OSF measurement of A was conducted on a silicon wafer after the two steps of heat-treatments to be required to manufacture an SOI substrate.

in D. the common OSF measurement of A was conducted on the SOI layer of an SOI substrate actually manufactured by the same method as applied to the case C with two silicon wafers as starting material.

Figure 1A:
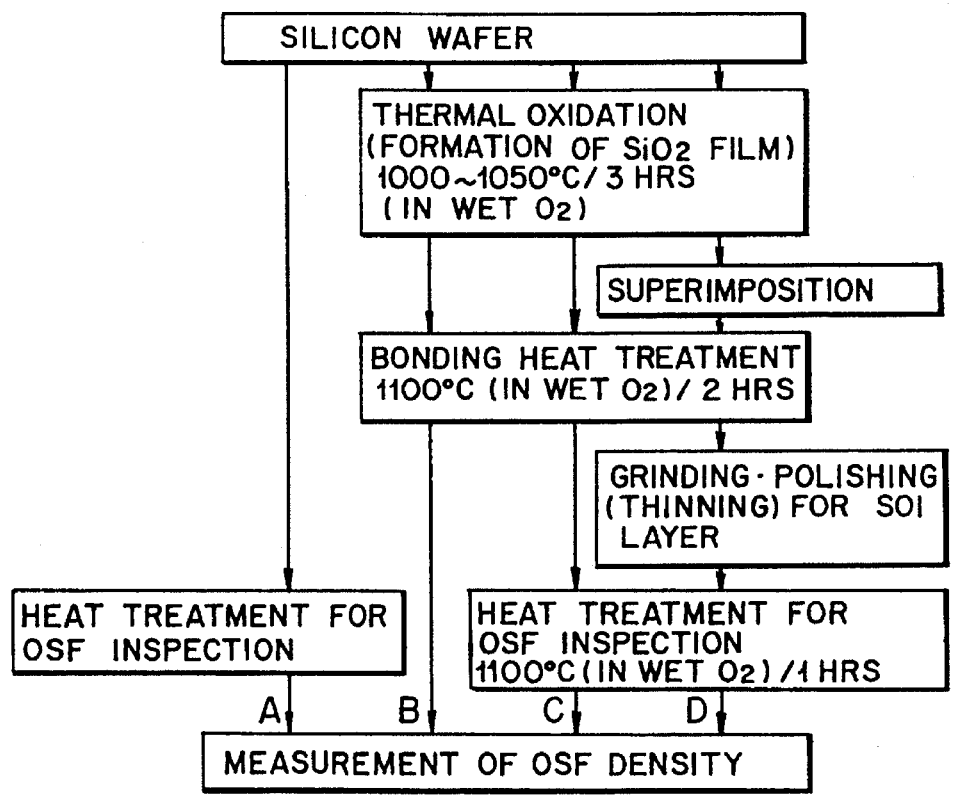
FIG. 1(a) is a schematic diagram illustrating the steps of each of experiments conducted under given four different conditions, where.
Figure 1B:
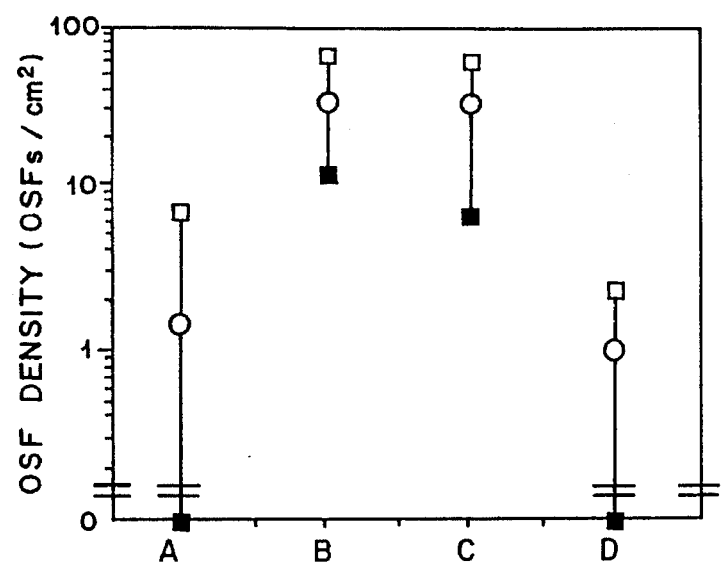

FIG. 1(b) is a graph showing respective data spreads and averages of OSF densities observed in cross scanning on each of the samples by the common OSF measurement or the OSF counting.

Figure 2:
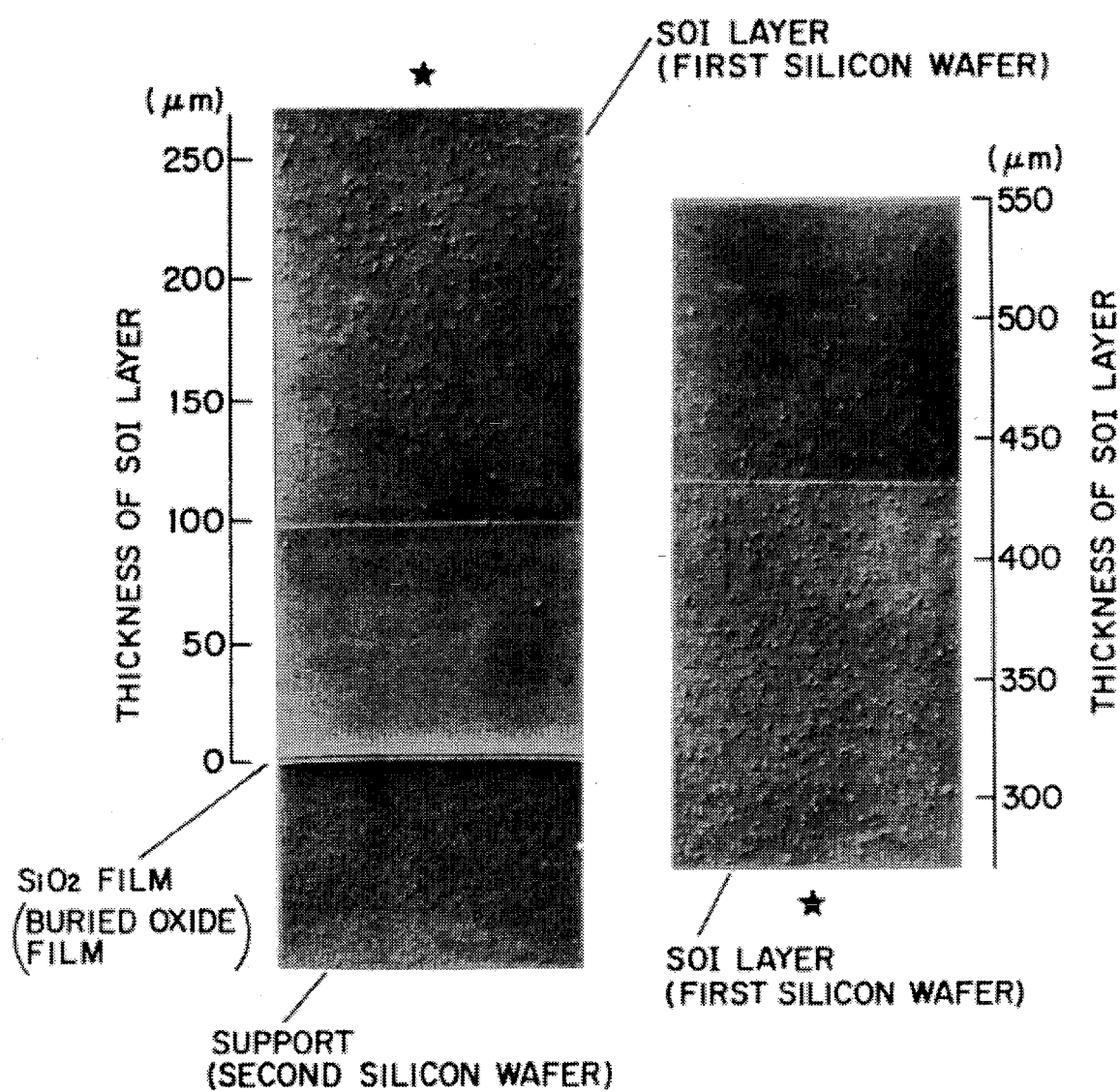

FIG. 2 is photographs of an differential interference microscope showing distribution of crystallographic defect densities in the direction of thickness in the interior of the SOI layer, which was processed from the first silicon wafer, of the SOI substrate after the heat-treatment for bonding, the surface on which the photographs was taken being prepared by the angle polishing. The SOI substrate was prepared under the same conditions as applied to that of the sample D with an exception of the OSFs being measured without the steps of thinning and the heat treatment for OSF inspection of the bonded wafer.

Figure 3:
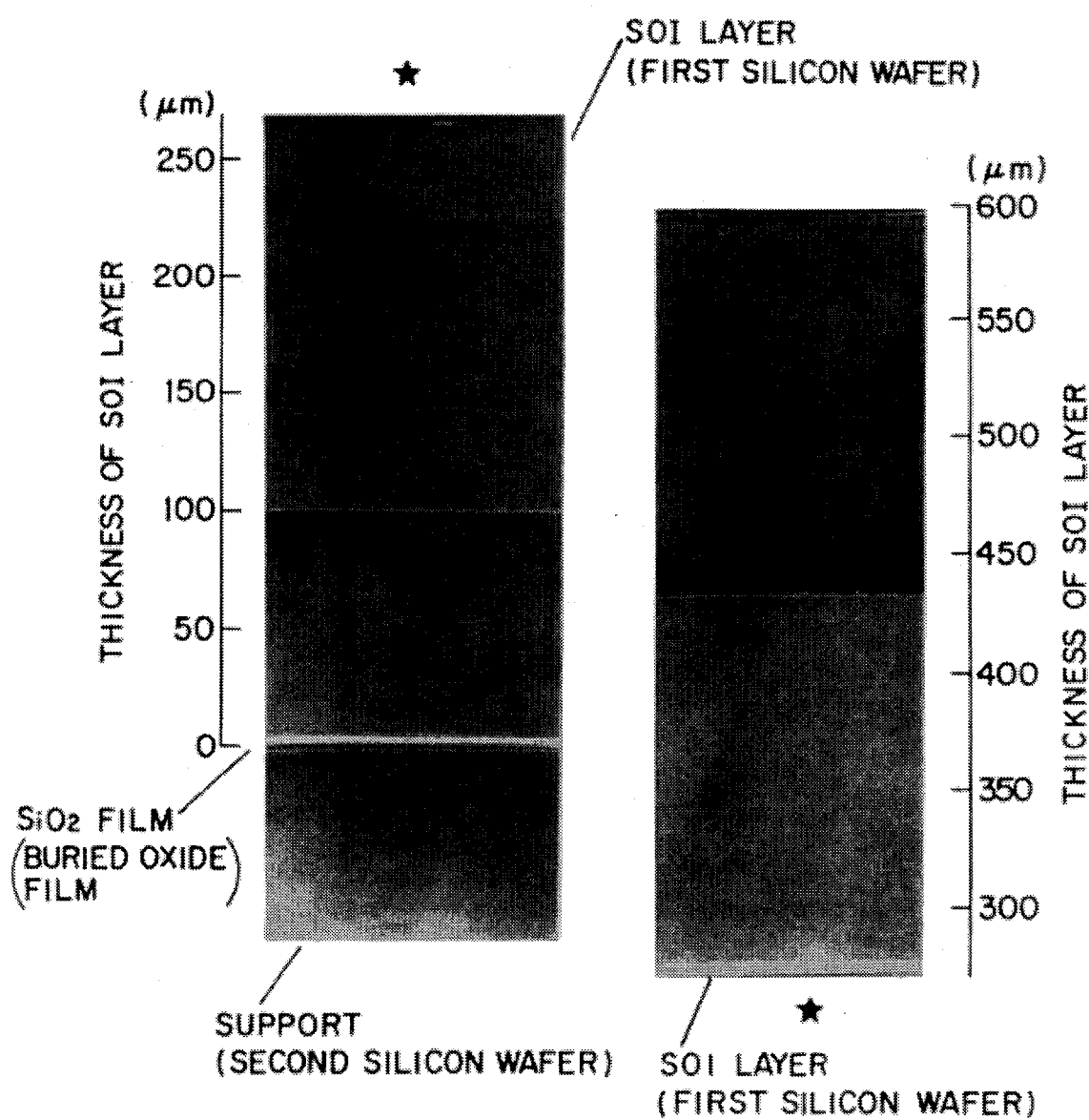

FIG. 3 is photographs of the differential interference microscope showing distribution of crystallographic defect densities in the direction of thickness in the interior of the SIO layer, which was processed from the first silicon wafer, of the bonded wafer directly after the heat treatment for bonding under the essentially same conditions as those in Example 2, which will be described later.

DETAILED DESCRIPTION OF THE PREFERRED EMBODIMENTS

Below will embodiments of the present invention be in depth described in reference to the drawings.

There were firstly prepared pairs of silicon wafers that have respective different concentrations of interstitial oxygen each of which wafers is polished only across one of the main surfaces. SOI substrates were manufactured following the same steps and under the same conditions as those of the experiment D above-mentioned and then the bulks of the first silicon wafers were thinned by grinding and polishing off the surfaces thereof to form the SOI layers with a thickness of about 50 μm for the following measurement of OSF densities. The measurement of OSF densities were conducted under the same condition as the above-mentioned common OSF measurement. The interstitial oxygen concentrations of each pair of the silicon wafers were respectively selected as 18.5 ppma for Comparison Test 1, 16.1 ppma for Example 1, 15.0 ppma for Example 2 and 9.8 ppma for Example 3. In the case of the interstitial oxygen concentration of 18.5 ppma, high densities of OSF are observed locally along the periphery of the surface of the SOI layer, which topped a density of 10 OSFs per $cm^2$ at highest, whereas the other SOI layers only showed OSF densities under 5 OSFs per $cm^2$ across the surfaces thereof.

FIG. 3 is photographs showing distribution of OSF densities in the direction of thickness in the interior of the SOI layer prepared under the same conditions as those of Example 2 with exceptions of the thickness and omission of the heat treatment for OSF inspection, which is processed from the first silicon wafer, same as those of FIG. 2 and occurrence of OSFs was not observed throughout the whole thickness totaling to 600 μm. The photographs in FIG. 3 was prepared with the same intention as that of those in FIG. 2 and the heat treatment for OSF inspection was also omitted.

There is another reason for which the present invention should be paid attention, which is described as follows:

A technology is conventionally known that silicon wafers for semiconductor devises have conventionally a concentration of interstitial oxygen of as high as about 16 ppma or more and are treated in the fabrication process by the intrinsic gettering heat-treatment (hereinafter referred to as IG treatment) so as to form DZ layer in the side of a silicon wafer, where semiconductor devises are fabricated therein.

The following steps are shown as a typical process for IG treatment:

(The first step) High temperature treatment: at a temperature of 1100° C. to 1200° C. for 1 hour to 25 hours in a $N_2$ or $O_2$ atmosphere;

(The second step) Low temperature treatment: at a temperature of 650° C. to 800° C. for 2 hours to 10 hours in a $N_2$ or $O_2$ atmosphere;

(The third step) Medium temperature treatment: at a temperature of 900° C. to 1100° C. for 5 hours to 10 hours. The period of time during which the high temperature treatment above-mentioned is practically selected about 20 hours in general.

IG treatment in fabrication of the SOI substrate of the present invention has a general trend that shorter periods of time are applied to the respective steps thereof as compared with those of the above-mentioned IG treatment as shown in case of the sample D, where the same three steps are applied to the sample at almost the same level of temperatures.

In addition, the SOI layer of an SOI substrate is generally effective to form a DZ layer at a lower concentration of interstitial oxygen than a single silicon wafer.

An thermal oxide film on the surface of the first silicon wafer, which is processed to be the SOI layer at a later stage, is formed directly after cleaning of the first wafer and thus the film is effective for protection of the SIO layer from pollution of the exterior. This protection is sill effective to suppress occurrence of crystallographic defects in the bulk thereof and thereby, or according to the present invention, the performance of power devices may be improved. The second wafer does not necessarily have a requirement for being highly pure silicon single crystal, since the second wafer has only a role of mechanical support for the SOI layer, but if the quality is of the same as that of the first silicon wafer, it works at least to minimize technical troubles probably caused by thermal stress or pollution in the heat treatments.

As clearly understood from the above description, the manufacturing method of the present invention may control occurrence of OSFs to minimize practically to the level of null. Consequently the use of the SOI substrate will not fail to expand into prosperous big fields such as that of the power IC.

What is claimed is:

1. A SOI substrate having a structure that it comprises a first silicon wafer, being a single crystal layer, which is processed to a SOI layer for semiconductor devises fabricated therein and a second silicon wafer which is a support for supporting the first silicon wafer, and the both wafers are bonded each other face to face with an silicon oxide film sandwiched therebetween, characterized in that the first silicon wafer has a concentration of interstitial oxygen under 16 ppma (per JEIDA Standard); that the thickness of the SOI layer is more than 5 μm; and that the whole bulk thereof is a DZ layer.

2. A manufacturing method for a SOI substrate, wherein two silicon wafers are bonded each other face to face with a silicon oxide film sandwiched therebetween, characterized in that an silicon oxide film is formed by thermal oxidation on the surface of a first silicon wafer having a concentration of interstitial oxygen under 16 ppma (per JEIDA Standard); that the first silicon wafer is superimposed on a second silicon wafer, being a support for supporting the first silicon wafer, with the silicon oxide film sandwiched therebetween and then the superimposed wafers are heat-treated so as to obtain a bonded wafer; and that the bulk of the first silicon wafer of the bonded wafer is reduced by grinding and then polishing so as to obtain an SOI substrate having an SOI layer of more than 5 μm in thickness, which is a single crystal layer, formed on the second silicon wafer.

3. The manufacturing method for the SOI substrate claimed in claim 2, characterized in that the silicon oxide film is formed by the thermal oxidation at a temperature between 1000° C. to 1300° C. and that the thickness of the silicon oxide film is so regulated as to be in a range of 0.1 μm to 5 μm.

4. The manufacturing method for the SOI substrate claimed in claim 2, characterized in that the heat-treatment for obtaining the bonded wafer is carried out at a temperature selected in a range of 1000° C. to 1200° C. for at least 30 min and that the thickness of the DZ layer in the SOI layer, which is a single crystal silicon layer, processed from the first silicon wafer is at least more than 5 μm.

* * * * *